United States Patent

Solomon

[11] Patent Number: 5,919,305
[45] Date of Patent: Jul. 6, 1999

[54] ELIMINATION OF THERMAL MISMATCH DEFECTS IN EPITAXIALLY DEPOSITED FILMS THROUGH THE SEPARATION OF THE SUBSTRATE FROM THE FILM AT THE GROWTH TEMPERATURE

[75] Inventor: Glenn S. Solomon, Redwood City, Calif.

[73] Assignee: CBL Technologies, Inc., Redwood City, Calif.

[21] Appl. No.: 09/109,610

[22] Filed: Jul. 2, 1998

Related U.S. Application Data

[60] Provisional application No. 60/051,816, Jul. 3, 1997, and provisional application No. 60/051,688, Jul. 3, 1997.

[51] Int. Cl.⁶ .................................................. C30B 25/04
[52] U.S. Cl. .......................... 117/90; 117/94; 117/95; 117/101; 117/913; 117/915; 117/952; 117/954
[58] Field of Search ................... 117/90, 94, 95, 117/101, 913, 915, 952, 954

[56] References Cited

U.S. PATENT DOCUMENTS

| | | | |
|---|---|---|---|
| 4,550,014 | 10/1985 | Baughman et al. | 117/915 |
| 5,073,230 | 12/1991 | Maracas et al. | 117/915 |
| 5,328,549 | 7/1994 | Bozler et al. | 117/915 |
| 5,620,557 | 4/1997 | Manabe et al. | 117/913 |
| 5,641,381 | 6/1997 | Bailey et al. | 117/915 |
| 5,679,152 | 10/1997 | Tischler et al. | 117/97 |
| 5,710,057 | 1/1998 | Kenney | 117/952 |

*Primary Examiner*—Robert Kunemund
*Attorney, Agent, or Firm*—Lumen Intellectual Property Services

[57] ABSTRACT

A concept and process is disclosed by which an epitaxially deposited film is removed from its substrate at elevated temperatures to inhibit thermal mismatch strain induced defect generation in the epitaxial layer. The process occurs by gas phase reactions of an intermediate layer purposely deposited to react with a component in the gas stream during or after epitaxial growth. While the concept of an intermediate layer has been used extensively to improve the crystal quality of the epitaxial layer this is not the purpose of this interlayer. Although this interlayer may aid in nucleation of the epitaxial layer, the objective is to separate the epitaxial material on top of the interlayer from the substrate below the interlayer at or near the growth temperature to reduce the effects of the thermal mismatch between the substrate and epitaxial layers. An application is an addition to the above invention. A thick epitaxially deposited film can now be removed from its substrate at elevated temperatures. This epitaxial layer can now be cooled without defect generation due to the difference in the thermal expansion of the substrate and epitaxy. The epitaxial layer now becomes a substrate for either further epitaxial deposition or device fabrication.

8 Claims, 4 Drawing Sheets

ELIMINATION OF THERMAL MISMATCH DEFECTS IN EPITAXIALLY DEPOSITED FILMS THROUGH THE SEPARATION OF THE SUBSTRATE FROM THE FILM AT THE GROWTH TEMPERATURE

CROSS-REFERENCE TO RELATED APPLICATIONS

This application claims priority from U.S. Provisional Patent Applications 60/051,816 and 60/051,688, both filed Jul. 3, 1997, and both of which are incorporated herein by reference.

BACKGROUND

1. Field of the Invention

The present invention relates to the field of the crystal growth of epitaxial films and substrates. In particular, the invention relates to the crystal growth of thermally mismatched epitaxy and substrate.

2. Description of Prior Art

Although heteroepitaxial crystal growth has been used for several decades, it is only recently that epitaxial growth in large mismatch systems has been examined. Examples of some mismatched material systems include GaAs epitaxy on Si substrates, and GaN epitaxy on sapphire substrates. The major concern in these systems has been the lattice mismatch between the epitaxy and substrate. The lattice mismatch is the difference in the appropriate fundamental crystallographic unit length (called the lattice constant) of the substrate and epitaxy. If this mismatch is too large the substrate does not form an acceptable template for the desired epitaxy. A poor substrate template results in epitaxy that contains a large defect density or epitaxy that is not oriented with respect to the substrate and is most often multi-domained. If the lattice mismatch is small the epitaxy will be commensurate, but the strain energy will increase with epitaxial thickness until the epitaxy relaxes through dislocation generation.

However, in some cases a large thermal expansion mismatch between the substrate and epitaxy is present and can be just as problematic as the lattice mismatch described above. The thermal expansion mismatch between the epitaxy and substrate is the difference in the change in lattice constants of the two materials with temperature. One technique for avoiding thermal mismatch problems is to remove the substrate entirely at the growth temperature. For example, U.S. Pat. No. 5,679,152 to Tischler et al. discloses a method of making a single crystal GaN substrate by epitaxially depositing the GaN on a growth substrate. At the growth temperature the substrate is completely etched away either before or after the GaN deposition is complete. When the GaN layer is then cooled, there is no thermal mismatch because the substrate is no longer present. This technique, however, has several disadvantages. Because the technique requires that the substrate is completely removed, significant etching is required by this approach. This etching adds cost and complexity to the process. In addition, it can also be difficult to hold the GaN layer in place after the sacrificial substrate is etched away.

It is instructive to note that other substrate removal processes have been used for various purposes unrelated to the thermal mismatch problem. These include the removal of the substrate from the epitaxy by etching or polishing away the substrate after the substrate-epitaxy system has been cooled. Thermal mismatch problems are not solved by such techniques. The motivation for this post-growth removal process is either to reduce optical absorption by the substrate or reduce resistive heating in the epitaxial layer by providing a better heat sink directly to the epitaxial layer. These two processes are motivated by electronic or optoelectronic device performance and are not related to structural issues of the epitaxy.

SUMMARY OF THE INVENTION

In view of the above, it is an object of the present invention to overcome the thermal mismatch problems associated with prior methods of producing epitaxial films. It is another object of the present invention to overcome these thermal mismatch problems without etching away the substrate. In one aspect of the invention, a method is provided to produce an epitaxial layer which has been separated from the substrate by gas phase etching of a predeposited layer, called an interlayer. It is an additional aspect of this invention to conduct the interlayer etching at elevated temperatures. In another aspect of the invention, a technique is provided to utilize this process as a mechanism to reduce thermal expansion mismatch strain and associated epitaxial damage when a thermal expansion mismatch between the substrate and epitaxial layer is present.

It is another aspect of the invention to use a preprocessed or patterned interlayer in the above process. The interlayer can be patterned to produce channels, ridges or holes of various dimensions. In this way the epitaxy can nucleate in non-interlayer regions and grow around the interlayer, yet the interlayer can still be etched to effectively decouple the thermal mismatch of the epitaxy from the substrate. Thus, the substrate and epitaxy do not need to be fully separated and/or the nucleating qualities of the substrate can be primarily used in the epitaxial growth—decoupling the interlayer from the epitaxial process.

An important component of this invention is the use of an interlayer material between the substrate and epitaxial layer. The interlayer is a thin homogeneous or patterned region that can be etched away at elevated temperatures so as to separate the epitaxial layer and substrate. Because the interlayer is very thin, it requires a small amount of etching to remove it as compared to prior art techniques that require removing the entire substrate, which is significantly thicker than the interlayer. Although nucleating layers have been used in epitaxial growth, there is no prior art that discloses the use of an interlayer that is gas phase etched at elevated temperatures to prevent thermal mismatch damage in an epitaxial film growth process.

This invention provides a method to separate the substrate from the epitaxy, in situ (i.e. at or near epitaxial deposition temperatures prior to cool down) using gas phase etching of an interlayer that is deposited in a separate procedure or in one step along with the epitaxy. An application is proposed as part of this invention in which the gas phase interlayer removal is used to separate a thick epitaxial deposition from the substrate at the growth temperature where the substrate-epitaxy thermal expansion mismatch would otherwise induce cracking or other structural defects in the epitaxy upon cooling from the deposition temperature. Because the substrate is separated and not etched or otherwise destroyed, it can be used again to grow another epitaxial layer. The present invention therefore enjoys reduced cost from both the fact that it is not necessary to etch a thick substrate, and the fact that the substrate can be reused.

To increase the effectiveness of the gas phase epitaxy-substrate separation, preferred embodiments of the invention include additional techniques. The first technique is the addition of preprocessing of the interlayer. The interlayer may be processed into a pattern that does not completely cover the substrate. This processing is accomplished before the epitaxial deposition of the main layer. The processing of the interlayer allows the main epitaxy to nucleate and grow directly on the substrate, so that when the interlayer is removed at or near the growth temperature the substrate remains in contact with the substrate in small regions. This technique can be used when the substrate forms a better nucleating surface for the epitaxy or when it is necessary to keep the epitaxy in contact with the substrate.

The second additional technique is a set of changes to the growth system design to increase the etching efficiency of the interlayer and keep this etching step isolated from the main epitaxial deposition region. This design includes clamps or pins to form the isolation and side injectors to introduce gases below the main deposition region.

DETAILED DESCRIPTION

The present invention resolves a problem in epitaxial deposition of a material on a substrate where the thermal expansion mismatch between the epitaxial layer and the substrate induces defect generation in the epitaxial layer upon cooling from the deposition temperature. The invention provides a process by which an epitaxial film is separated from its substrate at or near the epitaxial deposition temperature by gas phase etching of an interlayer. The interlayer can be deposited as part of the epitaxial process or in a different process. This invention is most favorably applied to a process in which the epitaxial layer is made of sufficient thickness so that the removal of the substrate does not result in structural failure of the epitaxial film.

The thermal mismatch is defined as the difference in the change of the lattice constants of two materials with respect to changing temperature. Prior art in the field of epitaxial growth mismatch problems is largely limited to techniques for depositing materials with a large lattice mismatch between the epitaxial layer and the substrate. The lattice mismatch is defined as the difference in the lattice constants of the epitaxy (or each component of the epitaxy) and the substrate. The present invention is directed to solving the problems associated with thermal mismatch, not lattice mismatch.

The invention can be applied to the fabrication of a thick, epitaxially deposited film on a substrate. In the case of a material system such as GaN, InN, AlN or their alloys, these materials can be deposited on a substrate and used as a homoepitaxial substrate for further device quality epitaxy. Although the invention applies to these various material systems, such as GaN or a related III-V, II-VI, or IV compound or alloy, for purposes of illustration it will be described primarily in relation to the production of GaN substrates, which is defined as including all the variants of GaN which are doped with other elements.

Figure 1A:
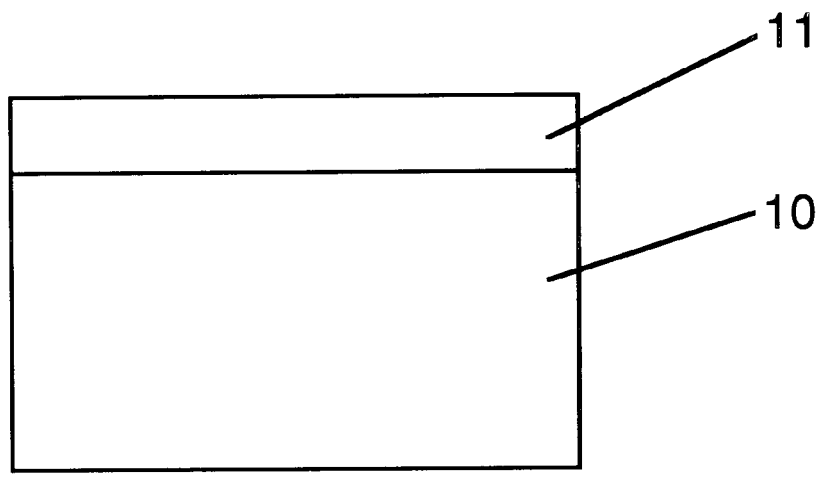
FIGS. 1a and 1b are side views of prior art where 1a shows the epitaxial layer and substrate at the deposition temperature, and 1b shows the epitaxial layer and substrate after a change in temperature has resulted in thermal mismatch defects in the epitaxial layer.
Figure 1B:
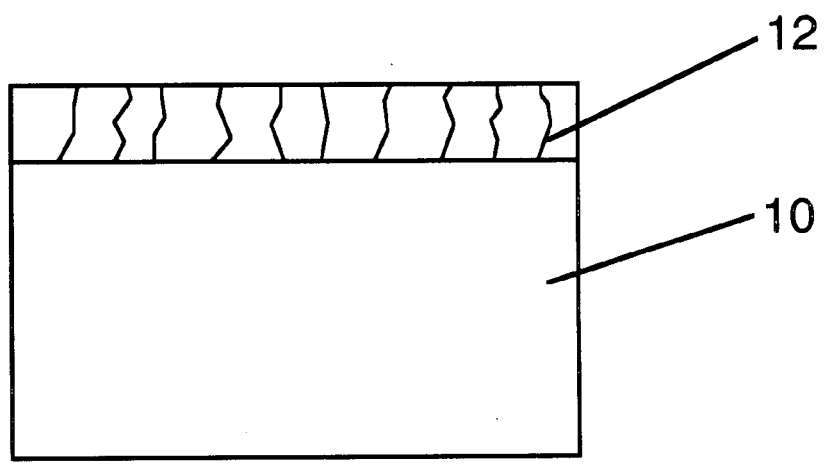

FIG. 1a shows a cross section of a conventional epitaxially deposited film 11 on a substrate 10 which is at the growth temperature, i.e., the temperature at which the epitaxial deposition takes places. Typically, the substrate is on the order of 300 microns thick and the epitaxial layer is on the order of 1 to 10 microns thick (i.e. the substrate is 30 to 300 times thicker than the epitaxial layer). In FIG. 1b the epitaxial layer and substrate are now at a different temperature. The deposited layer and substrate were free of strain at the growth temperature, but because of the thermal expansion mismatch between the two materials, upon cooling strain develops in the structure. This strain will exist in the both the epitaxy and substrate until the energy associated with the strain will exceed the energy required to create a structural change to relieve this strain. An example of such a structural change is a dislocation or crack; if the accumulated strain energy in the epitaxy exceeds the energy need to generate a crack or dislocation, the dislocation or crack is created, propagates and relieves the strain.

Figure 2A:
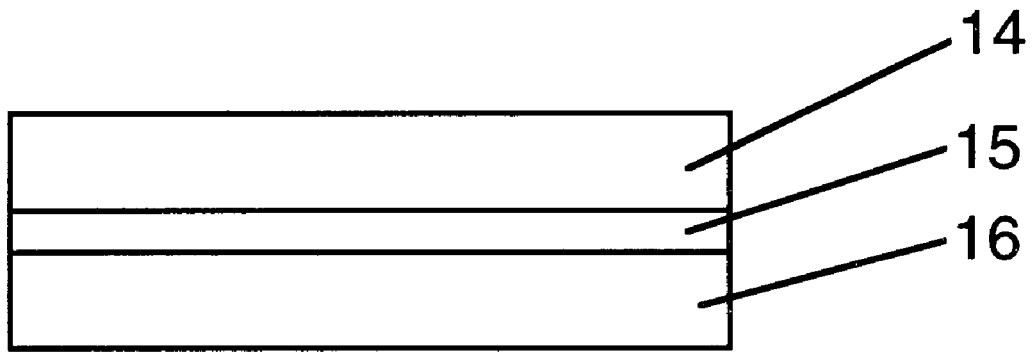
FIG. 2a is a side view of an epitaxial layer and substrate, now with an interlayer between them according to the invention.
Figure 2B:
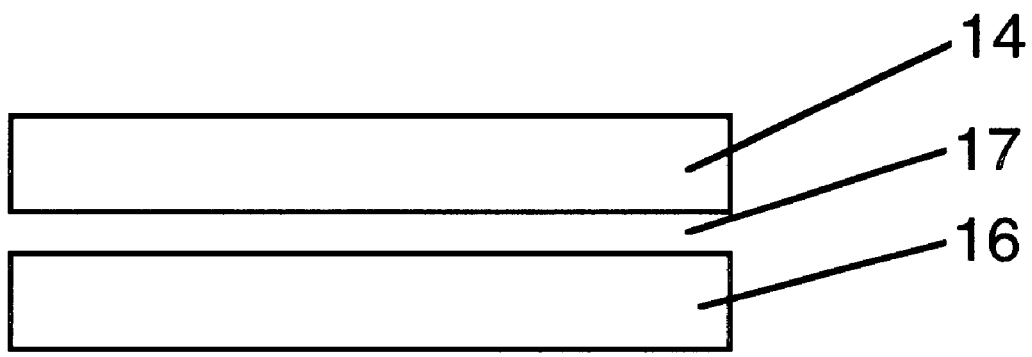
FIG. 2b is a side view of the same epitaxial layer-interlayer-substrate system of FIG. 2a after the interlayer has been removed.

In order to avoid or reduce the generation of cracks or defects in the epitaxial layer, a preferred embodiment of the present invention provides the following technique. In FIG. 2a an interlayer 15 has been deposited on top of the substrate 16 before the deposition of the epitaxy 14. The substrate may be composed of various compounds such as silicon, sapphire, or silicon carbide. The interlayer may be composed of various compounds such as silicon, silicon oxide, silicon nitride or silicon carbide. In FIG. 2b the interlayer has been removed at or near the growth temperature so that it either does not exist anymore, as shown by the void 17, or only a small amount remains to provide structural support. In a preferred embodiment of the invention, the substrate and epitaxial layers have typical thicknesses in the range of 50–300 microns. The epitaxial layer is deposited using standard chemical vapor deposition techniques, e.g. vapor phase epitaxy. In the preferred embodiment, hydride vapor phase epitaxy is used because it provides a fast growth rate, it is inexpensive and safe. The growth may be performed at high pressure, low pressure, or atmospheric pressure. These techniques are well known in the art and are commonly used to deposit epitaxial layers. The thickness of interlayer 15 is typically on the order of one micron or less. The interlayer is either predeposited, deposited as an initial component to the epitaxial process, or is formed on the substrate by some surface reaction. The interlayer may be composed of various different materials, for example silicon oxide, silicon nitride, or silicon carbide.

Figure 3A:
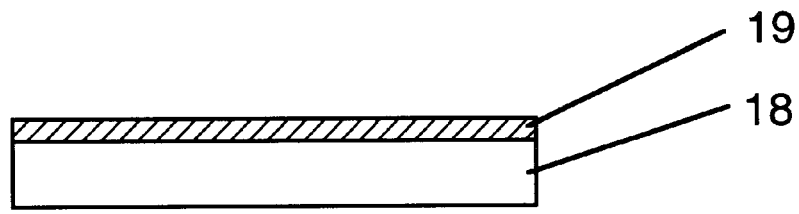
FIG. 3a is a side view of the interlayer deposited on top of the substrate according to the invention.
Figure 3B:
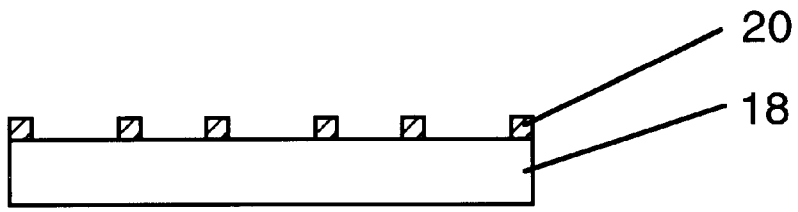
FIG. 3b is a side view of the interlayer deposited on top of the substrate after the interlayer has been patterned according to the invention.

In FIG. 3a a cross sectional view of substrate 18 and interlayer 19 is shown. In FIG. 3b the interlayer has been processed into a pattern 20, where the pattern is a set of strips on top of the substrate 18. Standard chemical vapor deposition techniques, such as vapor phase epitaxy, are used to deposit the thin pattern layer on the order of 0.1 to a few microns in thickness. The patterns typically contain structures spaced 10 to 1000 microns apart, although other spacings may be used depending on the particular substrate material and other parameters. Portions of the substrate may be exposed between the patterned structures to provide nucleation sites for the epitaxy.

Figure 3C:
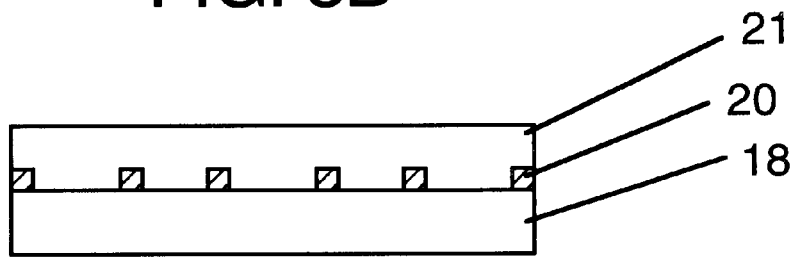
FIG. 3c is a side view of the patterned interlayer and substrate of FIG. 3b after the epitaxial layer has been deposited.
Figure 3D:
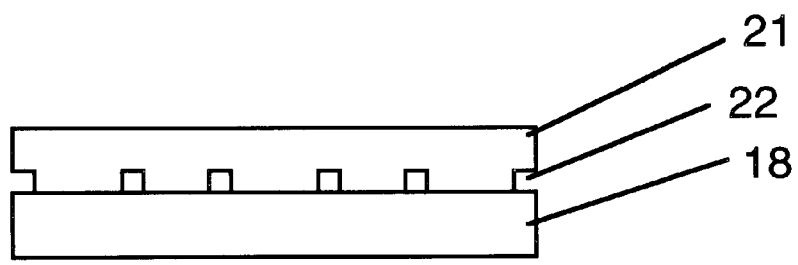
FIG. 3d is a side view of the epitaxial layer-patterned interlayer-substrate of FIG. 3c after the patterned interlayer has been removed.

In FIG. 3c epitaxy 21 has been deposited on top of the pattern interlayer 20 and the substrate 18. The epitaxy nucleates at the substrate interface, grows to the top of the interlayer, and then outwards across over the interlayer. In FIG. 3d the interlayer has been removed by etching before the sample is cooled so that thermal mismatch stresses are eliminated. Now the epitaxy is attached to the substrate only at small preselected regions so that the total thermal mismatch stress is reduced and the majority of the thermal mismatch strain is isolated to these small regions.

Figure 4:
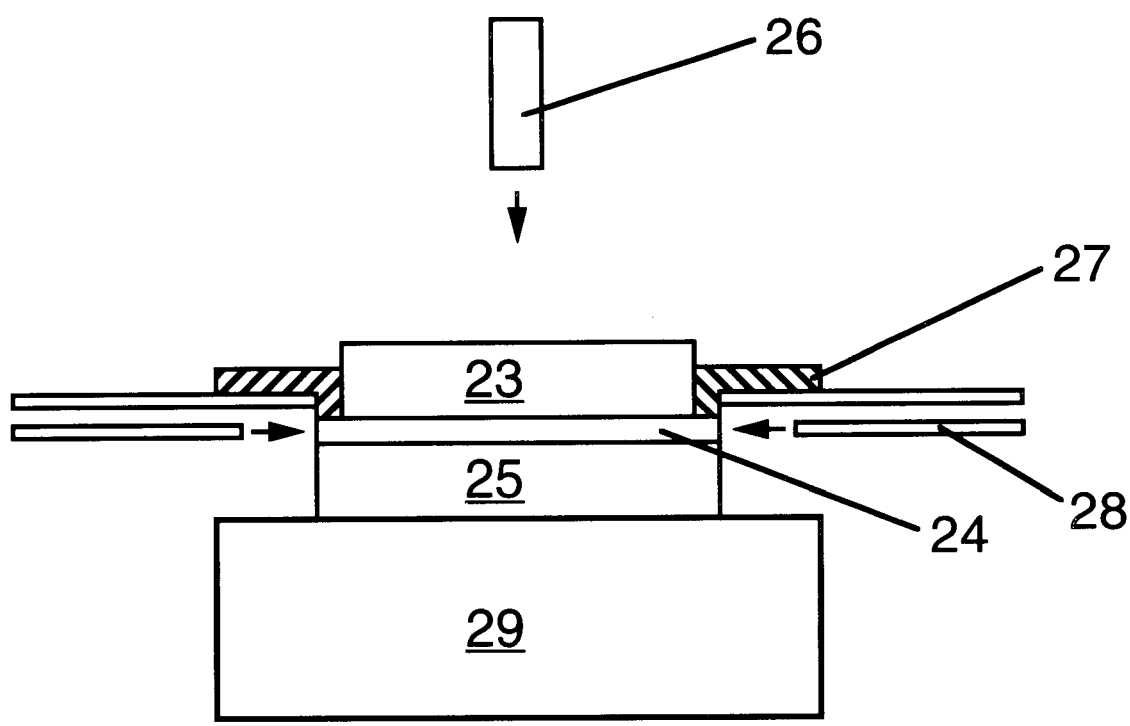
FIG. 4 is a side view of a sample holder for etching away an interlayer according to a preferred embodiment of the invention.

The invention provides a modified sample holder used for etching the interlayer with selected gases that are isolated from the epitaxial deposition section. In FIG. 4 the modified sample holder is shown, where 23 is the epitaxy 25 is the interlayer 25 is the substrate 26 is the injection point for the epitaxial gases 27 are pins which clamp down on the interlayer and isolate the region above the interlayer (the upper region) from the region below the interlayer (the lower region). A side gas injector 28 is used to selectively etch the interlayer material. A substrate heater block assembly 29 is used to heat the substrate during the process. The specific gasses used to etch the interlayer are selected to effectively etch the particular material selected for the interlayer. It will be appreciated that various materials and etchants can be used to accomplish the desired results. In addition, various etching techniques may be applied.

What is claimed:

1. A method for fabricating a thick layer of semiconductor material in a single growth apparatus, the method comprising:

depositing in the growth apparatus at a growth temperature using a chemical vapor deposition technique an epitaxial layer of the semiconductor material on an interlayer predeposited on a substrate, wherein the epitaxial layer and the substrate are thermally mismatched, and wherein the epitaxy comprises GaN, InN, AlN or alloys thereof;

removing in the growth apparatus substantially all of the interlayer at the growth temperature prior to cool down using a gas phase etching technique applied laterally to the interlayer so that the epitaxial layer is substantially separated from the substrate; and cooling down the epitaxial layer and the substrate;

whereby a thick, high quality layer of semiconductor material having reduced thermal mismatch damage is produced.

2. The method of claim 1 wherein the substrate is silicon, sapphire, or silicon carbide.

3. The method of claim 1 wherein the interlayer is composed of silicon, silicon oxide, silicon nitride or silicon carbide.

4. The method of claim 1 wherein the interlayer is patterned such that the removing of the interlayer leaves the epitaxial layer and substrate attached at preselected regions.

5. The method of claim 1 wherein the interlayer is patterned such that portions of the substrate are exposed, and wherein the exposed portions of the substrate provide nucleation sites for the epitaxy.

6. The method of claim 1 wherein the semiconductor material is GaN or a related III-V, II-VI, or IV compound or alloy.

7. A layer of semiconductor material made according to the method of claim 1.

8. An apparatus for fabricating a thick layer of semiconductor material, the apparatus comprising:

means for depositing at a growth temperature in an upper region of the apparatus using a chemical vapor deposition technique an epitaxial layer of the semiconductor material on an interlayer predeposited on a substrate, wherein the epitaxial layer and the substrate are thermally mismatched;

means for removing in a lower region of the apparatus substantially all of the interlayer at the growth temperature using a gas phase etching technique so that the epitaxial layer is substantially separated from the substrate prior to cool down; and means for substantially isolating the upper region from the lower region so that the chemical vapor deposition in the upper region is isolated from the gas phase etching in the lower region.

* * * * *